(12) United States Patent
Fotouhi

(10) Patent No.: US 6,683,473 B2
(45) Date of Patent: Jan. 27, 2004

(54) INPUT TERMINATION WITH HIGH IMPEDANCE AT POWER OFF

(75) Inventor: Bahram Fotouhi, Cupertino, CA (US)

(73) Assignee: Exar Corporation, Fremont, CA (US)

( * ) Notice: Subject to any disclaimer, the term of this patent is extended or adjusted under 35 U.S.C. 154(b) by 0 days.

(21) Appl. No.: 10/093,227

(22) Filed: Mar. 5, 2002

(65) Prior Publication Data

US 2003/0169068 A1 Sep. 11, 2003

(51) Int. Cl.[7] .............................................. H03K 19/003
(52) U.S. Cl. ............................ 326/30; 326/34; 326/86
(58) Field of Search ............................. 326/30, 34, 68, 326/80, 81, 86

(56) References Cited

U.S. PATENT DOCUMENTS

| | | |
|---|---|---|
| 5,914,627 A | 6/1999 | Fotouhi |
| 5,926,056 A | 7/1999 | Morris et al. |
| 6,037,828 A | 3/2000 | Fotouhi |
| 6,137,311 A | * 10/2000 | Hedberg .................... 326/68 |

* cited by examiner

*Primary Examiner*—Anh Tran
(74) *Attorney, Agent, or Firm*—Townsend and Townsend and Crew LLP

(57) ABSTRACT

An input termination circuit with high impedance at power off, which includes a first transistor coupled between a first terminal and a second terminal. The input termination circuit also includes a control circuit that monitors voltages on the first and second terminals and a first voltage source. During power off conditions, the control circuit couples the gate of the first transistor to a voltage that will keep the first transistor off. The first transistor remains off even when the voltage levels at the first and second terminals vary wildly.

6 Claims, 3 Drawing Sheets

INPUT TERMINATION WITH HIGH IMPEDANCE AT POWER OFF

CROSS-REFERENCES TO RELATED APPLICATIONS

Not Applicable

STATEMENT AS TO RIGHTS TO INVENTIONS MADE UNDER FEDERALLY SPONSORED RESEARCH OR DEVELOPMENT

Not Applicable

REFERENCE TO A SEQUENCE LISTING, A TABLE, OR A COMPUTER PROGRAM LISTING APPENDIX SUBMITTED ON A COMPACT DISK.

Not Applicable

BACKGROUND OF THE INVENTION

The present invention relates in general to integrated circuits, and in particular to a versatile and efficient input termination method and circuitry with high impedance at power off.

Integrated circuits developed for applications such as data or telecommunication systems are often required to comply with standardized interface specifications and will vary depending on the standard. The transmission of information signals over transmission lines requires a termination impedance at the receiving side of the transmission line. Input termination circuits provide a termination impedance between input terminals. This termination impedance should match the characteristic impedance of the transmission line.

In the event of a power-failure at the receiving side of the transmission line, e.g., VDD=0V, the termination between the input terminals should go into a high-impedance mode so as not to load any driving circuitry connected to the input terminals.

FIG. 1 is a simplified high-level schematic diagram of a conventional input termination circuit 100. Incoming signals at terminals RTIP and RRING are differential signals that are ac coupled through a transformer (not shown) during normal operating conditions.

Generally, input termination circuit 100 provides a low-impedance termination between terminals RTIP and RRING during normal operating conditions and goes into a high-impedance mode during power-failure conditions. To operate properly, the voltages at terminals RTIP and RRING should remain sufficiently positive.

More specifically, a primary termination circuit 102 is coupled between terminals RTIP and RRING and includes a transistors M1 and resistors R1 and R2. A typical value for resistors R1 and R2 is 15 Ω. A control circuit 103 includes two transistors M2 and M3 and a resistor RG. A bias circuit 107 includes resistors R3 and R4, which provide a DC bias point of Vdd/2 at terminals RTIP and RRING. A typical value for resistors R3 and R4 is 10 KΩ.

During normal operating conditions, e.g., VDD>0V, a control signal CNTL controls the gate of transistor M1, via transistors M2 and M3. Control signal CNTL activates and deactivates primary termination circuit 102 by pulling the gate of transistor Ml high to VDD or low to ground, respectively. The control signal CNTL is generated from internal control logic.

During power-failure conditions, e.g., VDD=0V, transistors M2 and M3 turn off and resistor RG pulls the gate of transistor Ml to ground, turning it off. Thus, the termination between terminals RTIP and RRING goes into a high-impedance mode so as not to load any driving circuitry connected to terminals RTIP and RRING. During such power-failure conditions, the termination impedance seen between terminals RTIP and RRING is R3+R4. Transistor M1 stays off as long as the voltages at terminals RTIP and RRING are positive.

Input termination circuit 100 fails, however, if terminals RTIP and RRING become sufficiently negative to turn on transistor M1.

Thus, there is a need for an improved input termination circuit that operates under a variety of voltage levels at the input terminals.

BRIEF SUMMARY OF THE INVENTION

The present invention provides a method and circuitry for an input termination. In accordance with the teachings of the invention, included is a primary termination circuit that provides a termination impedance between input terminals that turns off during power-failure conditions. The primary termination circuit puts the input termination circuit into a high-impedance mode. This prevents loading of any driving circuitry connected to terminals. A control circuit coupled to the primary termination circuit ensures that it stays off during power-failure conditions even when the voltage levels at the input terminals vary widely.

Accordingly, in one embodiment, the present invention includes a first transistor coupled between a first terminal and a second terminal. A control circuit monitors voltages on the first and second terminals and a first voltage source. During power off conditions, the control circuit couples the gate of the first transistor to a voltage that will keep the first transistor off.

Another embodiment includes a second transistor and a third transistor. During power off conditions, the second and third transistors couple the gate of the first transistor to the its acting source.

Another embodiment includes a control circuit that has a first circuit and a second circuit that can operate without power from the first voltage source. The first and second circuits can operate from power coming from the terminal having the higher voltage level.

In another embodiment, if there is a power off condition and if the first terminal voltage is a threshold greater than the second terminal voltage, the control circuit pulls the gate of the second transistor to the highest voltage potential and pulls the gate of the third transistor to the lowest voltage potential. Moreover, if there is a power off condition and if the second terminal voltage is a threshold greater than the third terminal voltage, the control circuit pulls the gate of the third transistor to the highest voltage potential and pulls the gate of the second transistor to the lowest voltage potential.

Embodiments of the present invention achieve their purposes and benefits in the context of known circuit and process technology and known techniques in the electronic and process arts. Further understanding, however, of the nature, features, and advantages of the present invention is realized by reference to the latter portions of the specification, accompanying drawings, and appended claims.

DETAILED DESCRIPTION OF THE INVENTION

Figure 2:
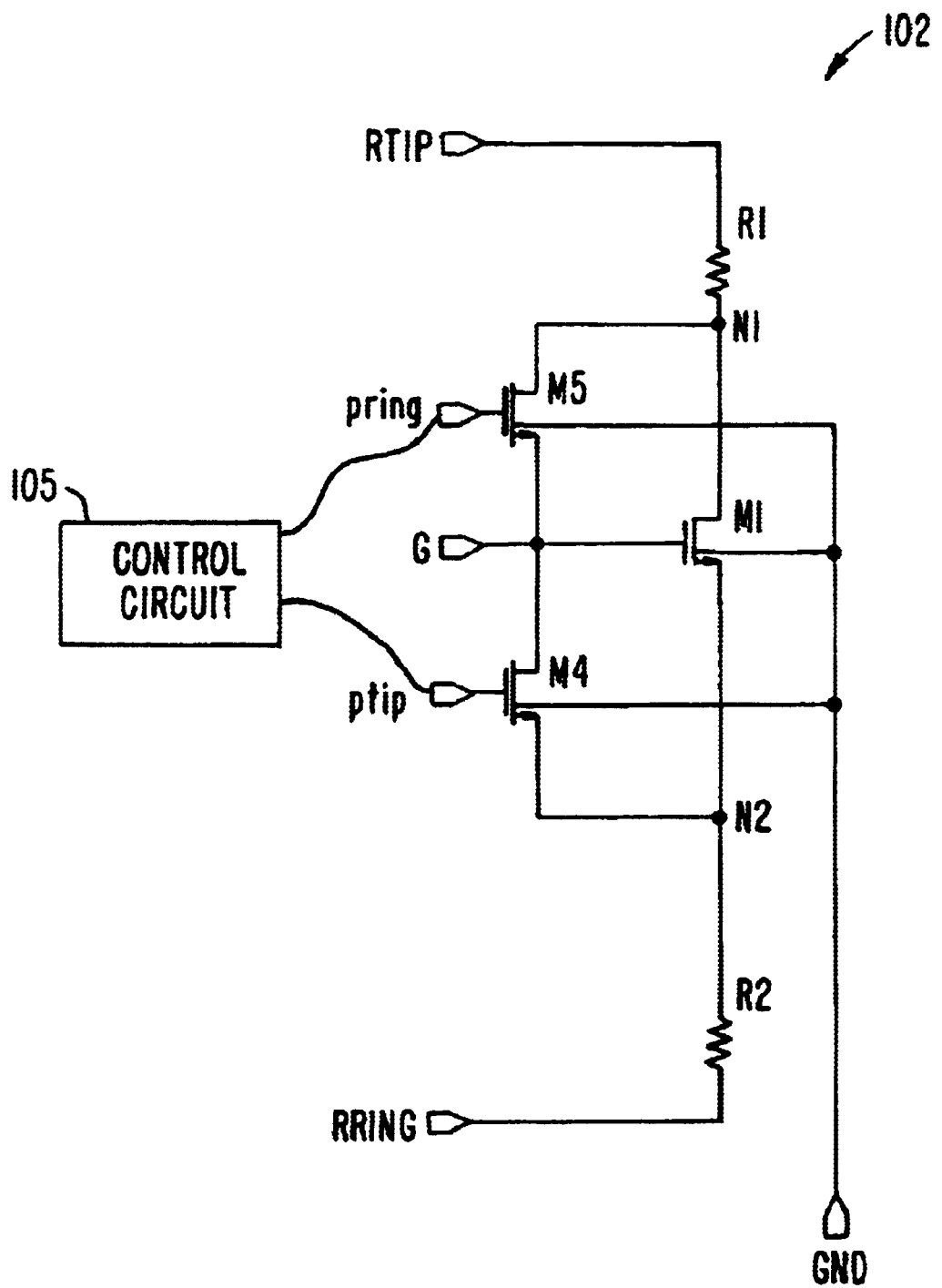
FIG. 2 is a simplified high-level schematic diagram of a primary termination circuit, according to one embodiment of the present invention.

FIG. 2 is a simplified high-level schematic diagram of a primary termination circuit 102, according to one embodiment of the present invention. Primary termination circuit 102 includes transistor M1 and resistors R1 and R2. Also included are transistors M4 and M5.

Generally, primary termination circuit 102 provides a low-impedance termination between terminals RTIP and RRING during normal operating conditions and is turned off to provide a high-impedance termination during power-failure conditions. Primary termination circuit 102 continues to operate properly even when the voltage levels at input terminals RTIP and RRING vary wildly.

Figure 1:
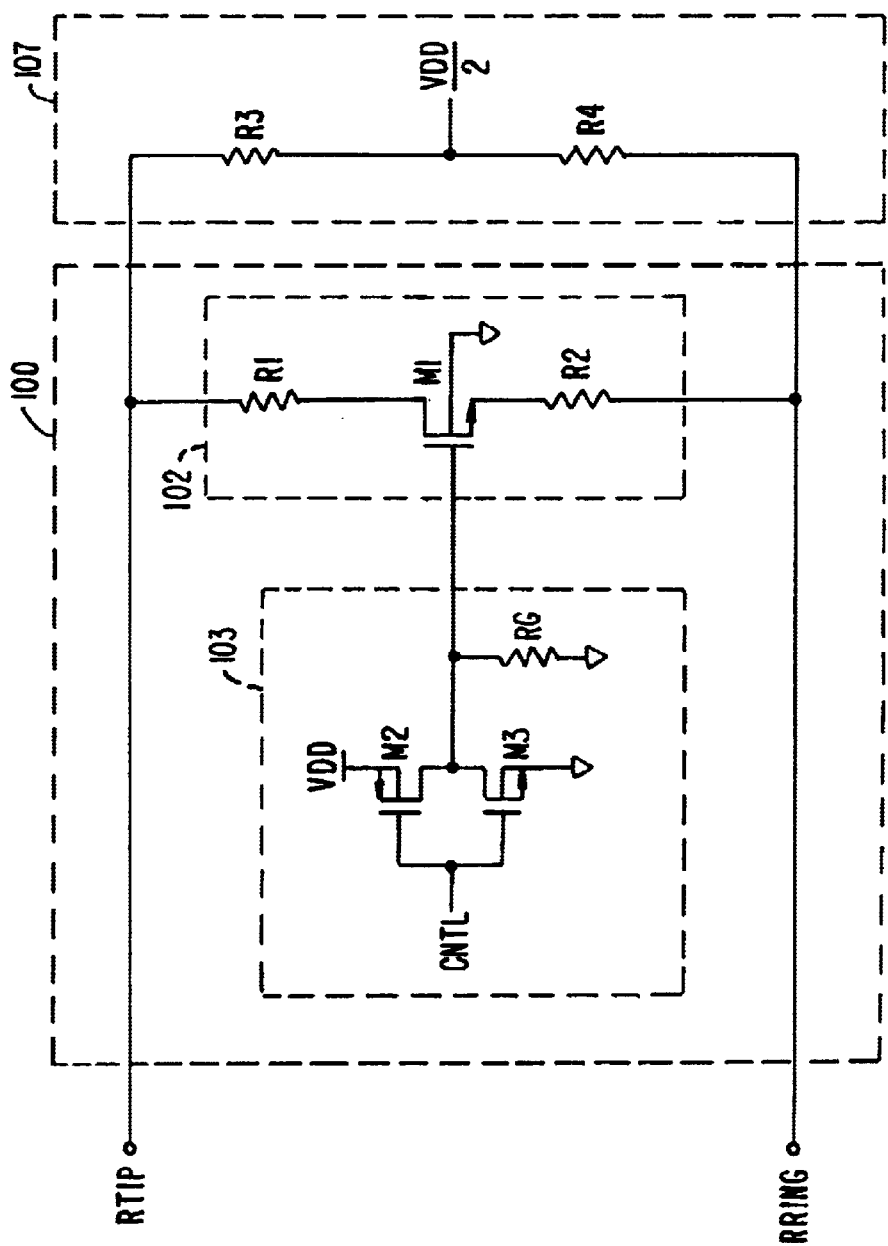
FIG. 1 is a simplified high-level schematic diagram of a conventional input termination circuit.

During normal operating conditions, e.g., VDD>0V, transistors M4 and M5 are off and a gate signal G controls transistor M1. During normal operating conditions, gate signal G performs the same function as control signal CNTL of FIG. 1. During power-failure conditions, e.g., VDD=0V, circuitry providing gate signal G (not shown) shuts down and transistors M4 and M5 couple the gate of transistor M1 to either of terminals RTIP or RRING by shorting the gate of transistor M1 to either nodes N1 or N2, respectively. The circuitry providing the gate signal G could be coming from the output of a simple inverter or a protected inverter as per invention entitled "Power Down Circuit for High Output Impedance State of I/O Driver," application Ser. No. 09/978, 255, filed Oct. 15, 2001, incorporated herein by reference, where the output of the inverter drives point "INP1" and point G is the output terminal "OUT" shown in the faxed figure, FIG. 2.

Figure 3:
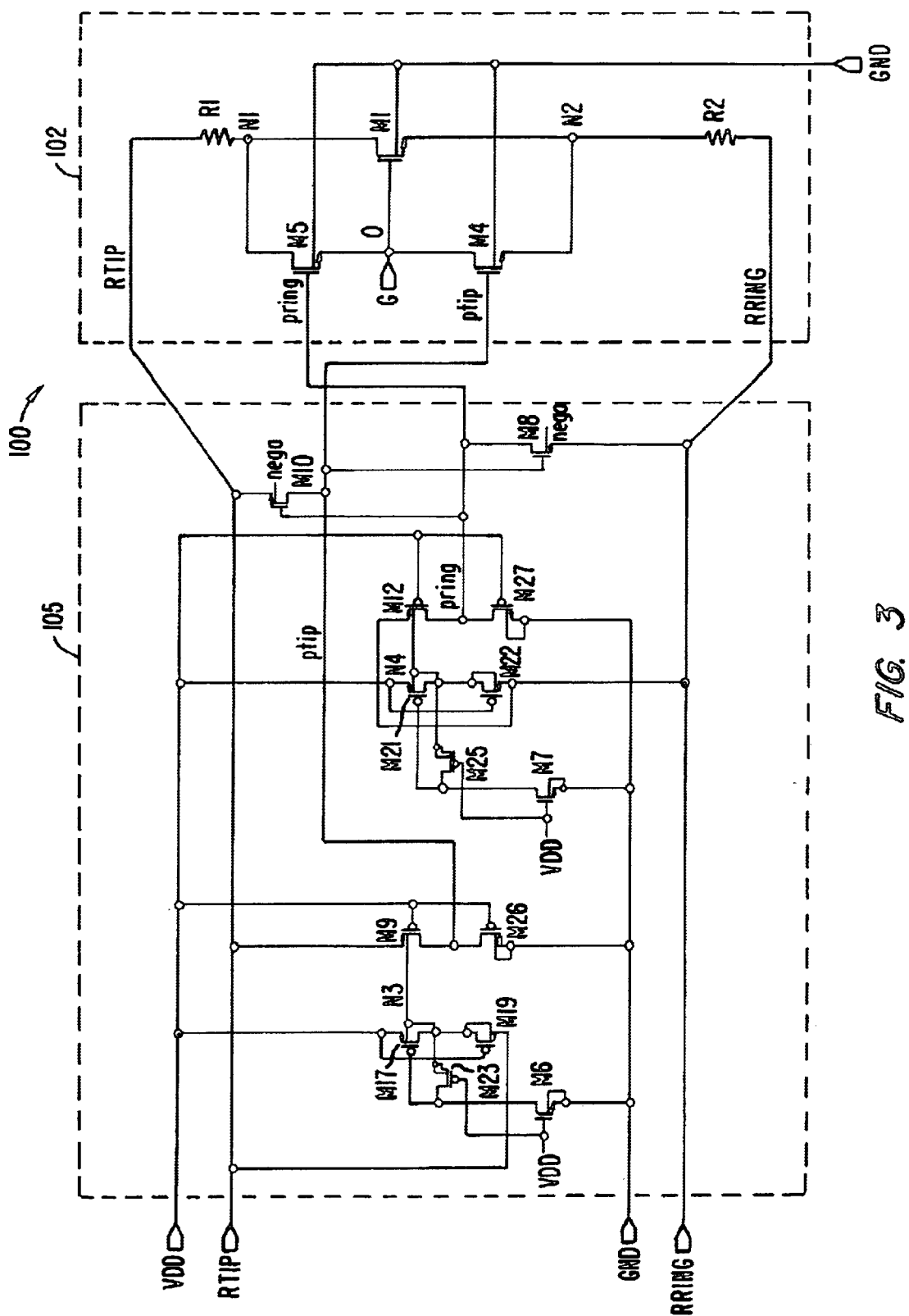
FIG. 3 is a diagram of the termination circuit of FIG. 2, showing the details of control circuit 105.

FIG. 3 is a diagram of the termination circuit of FIG. 2, showing the details of control circuit 105. Input termination circuit 100 includes primary termination circuit 102 of FIG. 2 and control circuit 105. In operation, control circuit 105 senses the voltages at terminals RTIP and RRING. Based on those voltages, control circuit 105 provides control voltages at output nodes ptip and pring. Nodes ptip and pring control the gates of transistors M4 and M5, respectively. As described above, transistors M4 and M5 control primary termination circuit 102 via transistor M1.

During normal operating conditions, e.g., VDD>0V, control voltages at nodes ptip and pring are forced to 0V, turning transistors M4 and M5 off. Gate signal G controls transistor M1. Specifically, when VDD>0V, NMOS transistors M6 and M26 turn on. Transistor M26, being on, pulls node ptip to ground. PMOS transistor M17 turns on as its gate is pulled to ground through transistor M6. Transistor M17, being on, couples the common n-well node N3 of the PMOS transistors M9, M17, M19, and M23 to VDD. PMOS transistors M9, M19, and M23 turn off.

Similarly, NMOS transistors M7 and M27 turn on when VDD is on. Transistor M27, being on, pulls node pring to ground. PMOS transistor M21 turns on as its gate is pulled to ground through transistor M7. Transistor M21, being on, couples the common n-well node N4 of the PMOS transistors M12, M21, M22, and M25 to VDD. PMOS transistors M12, M22, and M25 turn off.

During power-failure conditions, e.g., VDD=0V, circuitry providing gate signal G (not shown) shuts down and transistors M4 and M5 couple the gate of transistor M1 to either of terminals RTIP or RRING by shorting the gate of transistor M1 to either nodes N1 or N2, respectively. Specifically, control circuit 105 determines which of terminals RTIP and RRING is positive and which is negative. Control circuit 105 couples nodes ptip and pring to terminals RTIP and RRING, respectively. Since the transformer coupled signals RTIP and RRING are differential signals, when Vdd=0, the common mode voltage at RTIP and RRING will be set at zero volts due to R3/R4 of FIG. 1. Thus VRTIP=−VRRING.

If terminal RTIP is positive, e.g., $V_{RTIP}$=+1V, and RING is negative, e.g., $V_{RRING}$=−1V, node ptip will couple to terminal RTIP and node pring will couple to terminal RRING. As a result, transistor M4 turns on and transistor M5 turns off. Accordingly, transistor M1 turns off because its gate couples to its source (node N2). Node N2 is the source in this scenario because the voltage at terminal RTIP is greater than the voltage at terminal RRING.

More specifically, transistors M6 and M26 turn off. If the voltage at terminal RTIP is more positive than the voltage at terminal RRING by a PMOS threshold voltage, transistors M9, M19, and M23 turn on, tying the common n-well node N3 to terminal RTIP through transistor M19. Node N3 becomes the source of PMOS transistor M17, and because transistor M23 is on, the gate of transistor M17 couples to its source. Transistor M17 thus turns off while terminal RTIP swings more positive.

Also, node ptip couples to terminal RTIP because transistor M9 is on. Node pring couples to terminal RRING because transistor M8 turns on, when node ptip couples to terminal RTIP. Because terminal RRING is negative with respect to ground, transistors M7, M12, M21, M22, M25, and M27 will all turn off. As a result, node ptip will be connected to the most positive voltage and node pring will be connected to the most negative voltage.

In contrast, if terminal RRING is positive, e.g., $V_{RRING}$=+1V, and terminal RTIP is negative, e.g., $V_{RTIP}$=−1V, node pring will be coupled to terminal RRING and node ptip will be coupled to terminal RTIP. As a result, transistor M5 turns on and transistor M4 turns off. Accordingly, transistor M1 turns off because its gate couples to its source (node N1). Node N1 is the source in this scenario because the voltage at terminal RRING is greater than the voltage at terminal RTIP.

More specifically, transistors M7 and M27 turn off. If the voltage at terminal RRING is more positive that the voltage at terminal RTIP by a PMOS threshold voltage, transistors M12, M22, and M25 turn on, tying the common n-well node N4 to terminal RRING. Node N4 becomes the source of PMOS transistor M21, and because transistor M25 is on, the gate of transistor M21 couples to its source. Transistor M21 thus turns off while terminal RRING swings more positive. Also, node pring couples to terminal RRING because transistor M12 is on. Node ptip couples to terminal RTIP because transistor M10 turns on, when node pring couples to terminal RRING. Because terminal RTIP is negative with respect to ground, transistors M6, M9, M17, M19, M23, and M26 will all turn off. As a result, node pring will be connected to the most positive voltage and node ptip will be connected to the most negative voltage.

If both terminals RTIP and RRING tend to become positive with respect to ground, both nodes pring and ptip will be positive and transistor M1 will turn off. For example, if VRTIP=Vptip>VRRING=Vpring>0V, transistor M4 will turn on and transistor M5 will turn off, connecting the gate of transistor M1 to the least positive voltage, thus turning it off.

Under this condition, Vgs4=Vptip−Vrring=Vrtip−Vrring>0, Vgs5=Vpring−Vg1=Vrring−Vrring=0. Where Vg1 is the gate voltage of M1 pulled to Vrring due to M4 being on. Thus M4 is on and M5 is off.

Using the same argument as above, for the reverse case of VRRING=Vpring>VRTIP=Vptip>0V, M5 will be on and M4 will be off. If both terminals RTIP and RRING tend to become negative with respect to ground then due to presence of pn-junction, diodes of the source- or drain-to-bulk junctions of NMOS devices connected to RTIP and RRING nodes, Vrring or Vrtip, whichever is initially more negative, will be clamped at one diode drop below ground at −Vd. Since RTIP/RRING nodes are connected to opposite ends of the secondary of a transformer, the voltage difference |VRTIP−VRRING| will tend to be set by the turn ratio and the voltage difference at the primary of the transformer. As soon as one of the RTIP or RRING nodes swing more negative than Vd that node will be clamped at −Vd and the other node level will be shifted up so that the voltage difference |VRTIP−VRRING| to remain almost constant. Therefore if initially VRTIP<VRRING<0V, then Vrtip will clamp at Vd, i.e., Vrtip=−Vd, causing Vrring=−Vd−(Vrtip−Vrring)=VPRING>0. This will cause M5 to turn on and M4 to be off. With the gate of M1 pulled to Vrtip=−Vd, M1 will be off. The reverse is true for VRRING<VRTIP<0V.

Thus, during power-failure conditions, e.g., VDD=0V input termination circuit 100 of the present invention keeps transistor M1 off for all voltage levels at terminals RTIP and RRING.

CONCLUSION

In conclusion, it can be seen that embodiments of the present invention provide numerous advantages. Principally, they eliminate problems and limitations resulting from varying voltage levels at the input terminals during power off conditions. Specific embodiments of the present invention are presented above for purposes of illustration and description. The full description will enable others skilled in the art to best utilize and practice the invention in various embodiments and with various modifications suited to particular uses. After reading and understanding the present disclosure, many modifications, variations, alternatives, and equivalents will be apparent to a person skilled in the art and are intended to be within the scope of this invention. For example, a plurality of primary termination circuits can be implemented to provide different resistance values. In such embodiments one or more control circuits can control the primary termination circuits. Therefore, it is not intended to be exhaustive or to limit the invention to the specific embodiments described, but is intended to be accorded the widest scope consistent with the principles and novel features disclosed herein, and as defined by the following claims.

What is claimed is:

1. An input termination circuit comprising:
a first transistor coupled between a first terminal and a second terminal;
a control circuit configured to monitor voltages on the first and second terminals and on a first voltage source, the control circuit being configured to couple the gate of the first transistor to a voltage that will keep the first transistor off during power off conditions;
a second transistor and a third transistor, wherein during power off conditions, the second and third transistors are configured to couple the gate of the first transistor to the its acting source;
a control circuit comprising a first circuit and a second circuit that operate without power from the first voltage source and that operate from power coming from the terminal having the higher voltage level;
wherein the first circuit comprises:
a fourth transistor and a fifth transistor coupled in series between the first terminal and the second voltage source, the gates of the fourth and fifth transistors being coupled to the first voltage source;
a sixth transistor and a seventh transistor coupled in series between the first voltage source and the first terminal voltage, the gate of the seventh transistor being coupled to the first voltage source;
an eight transistor coupled between the gate of the sixth transistor and a first common n-well node, the first common n-well node being coupled between the sixth and seventh transistors, the gate of the eight transistor being coupled to the first voltage source; and
a ninth transistor coupled between the gate of the sixth transistor and the second voltage source, the gate of the ninth transistor being coupled to the first voltage source.

2. An input termination circuit comprising:
a first transistor coupled between a first terminal and a second terminal;
a control circuit configured to monitor voltages on the first and second terminals and on a first voltage source, the control circuit being configured to couple the gate of the first transistor to a voltage that will keep the first transistor off during power off conditions;
a second transistor and a third transistor, wherein during power off conditions, the second and third transistors are configured to couple the gate of the first transistor to the its acting source;
a control circuit comprising a first circuit and a second circuit that operate without power from the first voltage source and that operate from power coming from the terminal having the higher voltage level;
wherein the second circuit comprises:
a tenth transistor and an eleventh transistor coupled in series between the second terminal voltage and the second voltage source, the gates of the tenth and eleventh transistors being coupled to the first voltage source;
a twelfth transistor and a thirteenth transistor coupled in series between the first voltage source and the second terminal voltage, the gate of the thirteenth transistor being coupled to the first voltage source;
a fourteenth transistor coupled between the gate of the twelfth transistor and a second common n-well node, the first common n-well node being coupled between the twelfth and the thirteenth transistors, the gate of the fourteenth transistor being coupled to the first voltage source; and
a fifteenth transistor coupled between the gate of the twelfth transistor and the second voltage source, the gate of the fifteenth transistor being coupled to the first voltage source.

3. An input termination circuit comprising:
a first transistor having a first node coupled to a first terminal via a first resister and having a second node coupled to a second terminal via a second resistor;
a second transistor and a third transistor configured to couple to the first transistor and to turn the first transistor off during power off conditions, for all first and second terminal voltage levels; and a control circuit coupled between a first voltage source and a second voltage source and between the first and second terminals, the control circuit being configured to control the second and third transistors and configured to turn off the second and third transistors during power on conditions.

4. The input termination circuit of claim 3 wherein during power off conditions and if the voltage at the first terminal is a threshold greater than the voltage at the second terminal, the control circuit pulls the gate of the second transistor to the highest voltage potential and pulls the gate of the third transistor to the lowest voltage potential, and wherein during power off conditions and if the voltage at the second terminal is a threshold greater than the voltage at the third terminal, the control circuit pulls the gate of the third transistor to the highest voltage potential and to pulls the gate of the second transistor to the lowest voltage potential.

5. The control circuit of claim 4 further comprising:

a fourth transistor and a fifth transistor coupled in series between the first terminal and the second voltage source, the gates of the fourth and fifth transistors being coupled to the first voltage source;

a sixth transistor and a seventh transistor coupled in series between the first voltage source and the first terminal voltage, the gate of the seventh transistor being coupled to the first voltage source;

an eight transistor coupled between the gate of the sixth transistor and a first common n-well node, the first common n-well node being coupled between the sixth and seventh transistors, the gate of the eight transistor being coupled to the first voltage source; and a ninth transistor coupled between the gate of the sixth transistor and the second voltage source, the gate of the ninth transistor being coupled to the first voltage source.

6. The control circuit of claim 4 further comprising:

a tenth transistor and an eleventh transistor coupled in series between the second terminal voltage and the second voltage source, the gates of the tenth and eleventh transistors being coupled to the first voltage source;

a twelfth transistor and a thirteenth transistor coupled in series between the first voltage source and the second terminal voltage, the gate of the thirteenth transistor being coupled to the first voltage source;

a fourteenth transistor coupled between the gate of the twelfth transistor and a second common n-well node, the first common n-well node being coupled between the twelfth and the thirteenth transistors, the gate of the fourteenth transistor being coupled to the first voltage source; and a fifteenth transistor coupled between the gate of the twelfth transistor and the second voltage source, the gate of the fifteenth transistor being coupled to the first voltage source.

* * * * *

UNITED STATES PATENT AND TRADEMARK OFFICE
CERTIFICATE OF CORRECTION

PATENT NO.    : 6,683,473 B2
DATED         : January 27, 2004
INVENTOR(S)   : Bahram Fotouhi It is certified that error appears in the above-identified patent and that said Letters Patent is hereby corrected as shown below:

Title page,
Item [57], ABSTRACT,
Line 9, change "wildly" to -- widely --.

Signed and Sealed this

Twenty-second Day of June, 2004

JON W. DUDAS
*Acting Director of the United States Patent and Trademark Office*